US011566511B2

(12) United States Patent
Seah et al.

(10) Patent No.: US 11,566,511 B2
(45) Date of Patent: Jan. 31, 2023

(54) IMAGING INSIDE A STRUCTURE USING MAGNETO QUASISTATIC FIELDS

(71) Applicants: CHEVRON U.S.A. INC., San Ramon, CA (US); CALIFORNIA INSTITUTE OF TECHNOLOGY, Pasadena, CA (US)

(72) Inventors: Robert Kwan Meng Seah, Cypress, TX (US); Hailing An, Houston, TX (US); Thomas E. O'Donnell, Houston, TX (US); Darmindra Arumugam, Pasadena, CA (US)

(73) Assignees: Chevron U.S.A. Inc., San Ramon, CA (US); California Institute of Technology, Pasadena, CA (US)

( * ) Notice: Subject to any disclaimer, the term of this patent is extended or adjusted under 35 U.S.C. 154(b) by 88 days.

(21) Appl. No.: 17/089,539

(22) Filed: Nov. 4, 2020

(65) Prior Publication Data

US 2021/0131267 A1 May 6, 2021

Related U.S. Application Data

(60) Provisional application No. 62/931,144, filed on Nov. 5, 2019.

(51) Int. Cl.
*G01V 3/38* (2006.01)
*G01V 3/18* (2006.01)
*G01R 33/38* (2006.01)
*E21B 47/002* (2012.01)

(52) U.S. Cl.
CPC ............ *E21B 47/0025* (2020.05); *G01V 3/18* (2013.01); *G01V 3/38* (2013.01); *G01R 33/38* (2013.01)

(58) Field of Classification Search
CPC .. G01R 33/091; G01R 33/1269; G01R 33/09; G01R 33/38; G01R 33/448; G01N 33/54326; G01N 33/5434; G01N 24/08; G01V 3/18; G01V 3/38; G01V 3/26; G01V 3/28; E21B 47/0025
USPC ............................................. 324/207.21, 303
See application file for complete search history.

(56) References Cited

U.S. PATENT DOCUMENTS

| 2006/0235633 | A1 | 10/2006 | Simons | |
| 2008/0048640 | A1 | 2/2008 | Hull | |
| 2013/0113468 | A1* | 5/2013 | Gao | G01D 5/145 73/152.28 |

(Continued)

FOREIGN PATENT DOCUMENTS

WO 2018191428 A1 10/2018

OTHER PUBLICATIONS

Santini, Tales, et al. "In-vivo and numerical analysis of the eigenmodes produced by a multi-level Tic-Tac-Toe head transmit array for 7 Tesla MRI." PloS one 13.11 (2018): e0206127. (Year: 2018).*

(Continued)

*Primary Examiner* — Christopher P McAndrew
(74) *Attorney, Agent, or Firm* — Esplin & Associates, PC

(57) ABSTRACT

A magneto-quasistatic field may be used to align hydrogen of materials within a structure and/or to disrupt the alignment of hydrogen of materials within the structure. Realignment of the hydrogen after the disruption may cause emission of energy from the hydrogen. The characteristic(s) of the energy may be detected and used to generate image(s) of interior portion(s) of the structure.

18 Claims, 5 Drawing Sheets

(56) References Cited

U.S. PATENT DOCUMENTS

| | | | |
|---|---|---|---|
| 2014/0154454 A1* | 6/2014 | Ueki | C09K 3/1009 977/773 |
| 2014/0266164 A1 | 9/2014 | Arumugam | |
| 2016/0084077 A1* | 3/2016 | Lehr | E21B 21/103 367/83 |
| 2016/0245638 A1 | 8/2016 | Sheinker | |
| 2017/0074625 A1 | 3/2017 | Appleby | |
| 2017/0074630 A1 | 3/2017 | Kotsonis | |
| 2020/0190970 A1* | 6/2020 | Alvarez | E21B 47/10 |
| 2021/0131810 A1 | 5/2021 | Seah | |
| 2021/0135769 A1 | 5/2021 | Seah | |

OTHER PUBLICATIONS

"Downhole Applications of Magnetic Sensors" Sensors (Basel) Oct. 2017: 17(10):2384 by Chinthaka P. Gooneratne, Bodong Li and Timothy E. Moellendick, pp. 1-32.

A. Koutsou et al., "Preliminary localization results with an RFID based indoor guiding system," in Proc. IEEE WISP, 2007, pp. 1-6.

A. Legchenko, M. Descloitres, C. Vincent, H. Guyard, S. Garambois, et al.. Three-dimensional magnetic resonance imaging for groundwater. New Journal of Physics, Institute of Physics: Open Access Journals, 2011, 13, pp. 025022, 18 pages.

Abrudan, et al. Impact of Rocks and Minerals on Underground Magneto-Inductive Communication and Localization, Jun. 9, 2016, pp. 1-12.

B. Denis, J. Keignart, and N. Daniele, "Impact of NLOS propagation upon ranging precision in UWB systems," in Proc. IEEE Conf. Ultra Wideband Syst. Technol., 2003, pp. 379-383.

C. E. Shannon (Jan. 1949). "Communication in the presence of noise" (PDF). Proceedings of the Institute of Radio Engineers. 37 (1): 10-21.

D. Arumugam, J. Griffin, and D. Stancil, "Experimental demonstration of complex image theory and application to position measurement," IEEE Antennas Wireless Propag. Lett., vol. 10, pp. 282-285, 2011.

D. D. Arumugam, "Single-Anchor 2-D Magnetoquasistatic Position Sensing for Short to Long Ranges Above Ground," in IEEE Antennas and Wireless Propagation Letters, vol. 15, pp. 1325-1328, 2016.

D. D. Arumugam, "Through-the-wall indoor tracking and navigation using deep-sub-wavelength magnetoquasistatics," 2017 IEEE International Symposium on Antennas and Propagation & USNC/URSI National Radio Science Meeting, San Diego, CA, 2017, pp. 1409-1410.

D. D. Arumugam, "Through-the-Wall Magnetoquasistatic Ranging," in IEEE Antennas and Wireless Propagation Letters, vol. 16, pp. 1439-1442, 2017.

D. D. Arumugam, J. D. Griffin, D. D. Stancil and D. S. Ricketts, "Experimental study on the effects of groups of people on magnetoquasistatic positioning accuracy," Proceedings of the 2012 IEEE International Symposium on Antennas and Propagation, Chicago, IL, 2012, pp. 1-2.

D. D. Arumugam, M. Sibley, J. D. Griffin, D. D. Stancil and D. S. Ricketts, "An active position sensing tag for sports visualization in American football," 2013 IEEE International Conference on RFID (RFID), Penang, 2013, pp. 96-103.

J. B. Andersen, T. S. Rappaport and S. Yoshida, "Propagation measurements and models for wireless communications channels," in IEEE Communications Magazine, vol. 33, No. 1, pp. 42-49, Jan. 1995.

Legchenko, A., Baltassat, J-M., Beauce, A., and Bernard, J., 2002, Nuclear magnetic resonance as a geophysical tool for hydrogeologists: Journal of Applied Geophysics, v.50, No. 1-2, p. 21-46.

M. M. Khan, Q. H. Abbasi, A. Alomainy and Y. Hao, "Study of line of sight (LOS) and none line of sight (NLOS) ultra wideband off-body radio propagation for body centric wireless communications in indoor," Proceedings of the 5th European Conference on Antennas and Propagation (EUCAP), Rome, 2011, pp. 110-114.

M. Stojanovic and J. Preisig, "Underwater acoustic communication channels: Propagation models and statistical characterization," in IEEE Communications Magazine, vol. 47, No. 1, pp. 84-89, Jan. 2009.

Non-medical applications of NMR and MRI, MRI NMR Magnetic Resonance, retrieved from the internet [https://www.magnetic-resonance.org/ch/19-01.html]; Web version 11th edition 2017, Ch. 19, pp. 1-4.

Pake, G.E., 1993, Nuclear magnetic resonance in bulk matter: Physics Today, v.46, p. 46-51.

R. V. L. Hartley (Jul. 1928). "Transmission of Information". Bell System Technical Journal, pp. 535-563.

S. S. Ghassemzadeh, L. J. Greenstein, A. Kavcic, T. Sveinsson and V. Tarokh, "UWB indoor path loss model for residential and commercial buildings," 2003 IEEE 58th Vehicular Technology Conference. VTC 2003-Fall (IEEE Cat. N0.03CH37484), 2003, pp. 3115-3119 Vol.5.

Sana Ramadan, Master thesis: Underwater Communication Throught Magnetic Induction (MI); retrieved from the internet [(https://dalspace.library.dal.ca/bitstream/handle/10222/73429/Sana-Ramadan-MASc-ECED-October-2017.pdf?sequence=1&isAllowed=y)], Dalhousie University, Halifax, Nova Scotia, Oct. 2017 (55 pages).

Z. Jiang and P. Groves, "NLOS GPS signal detection using a dualpolarisation antenna," GPS Solutions, vol. 18, No. 1, pp. 15-26, 2014.

\* cited by examiner

IMAGING INSIDE A STRUCTURE USING MAGNETO QUASISTATIC FIELDS

CROSS-REFERENCE TO RELATED APPLICATIONS

The present application claims the benefit of U.S. Provisional Application No. 62/931,144, entitled "IMAGING INSIDE A STRUCTURE USING MAGNETO QUASISTATIC FIELDS," which was filed on Nov. 5, 2019, the entirety of which is hereby incorporated herein by reference.

STATEMENT REGARDING FEDERALLY SPONSORED RESEARCH OR DEVELOPMENT

This invention was made with government support under Grant No. 80NMO0018D0004 awarded by NASA (JPL). The government has certain rights in the invention. The invention described herein was made in the performance of work under a U.S. Government contract and is subject to the provisions of Public Law 96-517 (35 USC 202) in which the Contractor has elected to retain title.

FIELD

The present disclosure relates generally to the field of imaging using magneto quasistatic fields.

BACKGROUND

Evaluating conditions of a structure or identifying and locating objects inside a structure, such as a well or a tank, is difficult. For example, an object may have fallen into a wellbore, become stuck, have broken or formed a blockage during drilling which needs to be fished out or cleared from the well bore before drilling can continue. Zero light conditions inside the well and/or opaque high solids fluids inside the well may make it difficult to determine the location, orientation, and condition of the object inside the well using visual means (camera and lights). Typically, wellbore fishing operations rely on lead impression blocks run into the well which are pushed onto the object in the wellbore. The impression block may be retrieved to the drill floor and the impressions (dents, scratches, and other marks) formed on the bottom face of the block may be "interpreted". This operation may be repeated as required and may represent the only information available to inform the continued fishing operations. This information is difficult to interpret and costly to obtain. A more certain set of measurements describing the situation downhole during anomalous operations is desired.

SUMMARY

This disclosure relates to imaging using magneto quasistatic fields. A first field may be generated and maintained inside a structure to cause alignment of hydrogen of materials inside the structure. A second field may be generated inside the structure for a duration. The second field may cause temporary misalignment of hydrogen during the duration. Realignment of the hydrogen with the first field after the duration may cause emission of electromagnetic energy from the hydrogen. The electromagnetic energy emitted by the hydrogen may be detected by an electromagnetic energy detector. The electromagnetic energy detector may generate output signals conveying characteristics of the electromagnetic energy. An image of an interior portion of the structure may be generated based on the output signals and/or other information.

A system that images using magneto quasistatic fields may include one or more electronic storage, one or more processors, one or more alignment field generators, one or more disruption field generators, one or more energy detectors, and/or other components. The electronic storage may store information relating to a structure, information relating to magnetic field, information relating to magneto-quasistatic field, information relating to electromagnetic field, information relating to alignment of atoms and/or parts of atoms, information relating to misalignment of atoms and/or parts of atoms, information relating to realignment of atoms and/or parts of atoms, information relating to emission of energy from atoms and/or parts of atoms, information relating to energy emitted by atoms and/or parts of atoms, information relating to image of an interior portion of a structure, and/or other information.

An alignment field generator may be configured to generate and maintain an alignment field inside a structure. The alignment field may cause alignment of hydrogen of materials inside the structure. In some implementations, the alignment field generator may include a static magnetic field generator, and the alignment field may include a static magnetic field. In some implementations, the alignment field generator may include a magneto-quasistatic field generator, and the alignment field may include a magneto-quasistatic field.

A disruption field generator may be configured to generate a disruption field inside the structure for a duration. The disruption field may cause temporary misalignment of hydrogen during the duration. Realignment of the hydrogen with the alignment field after the duration may cause emission of energy from the hydrogen. In some implementations, the energy emitted from the hydrogen may include electromagnetic energy. In some implementations, the disruption field generator may include a magneto-quasistatic field generator, and the disruption field may include a magneto-quasistatic field. In some implementations, the disruption field generator may include an electromagnetic field generator, and the disruption field may include an electromagnetic field.

An energy detector may be configured to detect the energy emitted by the hydrogen during realignment of the hydrogen. The energy detector may be configured to generate output signals conveying characteristics of the energy. In some implementations, the energy detector may include an electromagnetic energy detector.

The processor(s) may be configured by machine-readable instructions. Executing the machine-readable instructions may cause the processor(s) to facilitate imaging using magneto quasistatic fields. The machine-readable instructions may include one or more computer program components. The computer program components may include one or more of an image component, and/or other computer program components.

The image component may be configured to generate an image of an interior portion of the structure based on the output signals and/or other information. In some implementations, generating the image of the interior portion of the structure based on the output signals may include measuring physical and/or chemical properties of the interior portion of the structure.

In some implementations, the structure may include a well, and the image of the interior portion of the well may facilitate condition determination of the well. In some implementations, the structure may include a well, an object may be located inside drill mud of the well, and the image of the interior portion of the well may facilitate location determination of the object within the drill mud of the well.

In some implementations, the structure may include a well, and the disruption field generator may be attached to an end portion of a drill string for placement within the well.

In some implementations, the structure may include a tank, the tank may include sludge, and the image of the interior portion of the tank may facilitate tank bottom inspection of the tank without removal of the sludge.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a," "an," and "the" include plural referents unless the context clearly dictates otherwise.

DETAILED DESCRIPTION

The present disclosure relates to imaging inside a structure. A magneto-quasistatic field may be used to align hydrogen of materials within a structure and/or to disrupt the alignment of hydrogen of materials within the structure. Realignment of the hydrogen after the disruption may cause emission of energy from the hydrogen. The characteristic(s) of the energy may be detected and used to generate image(s) of interior portion(s) of the structure.

Figure 1:
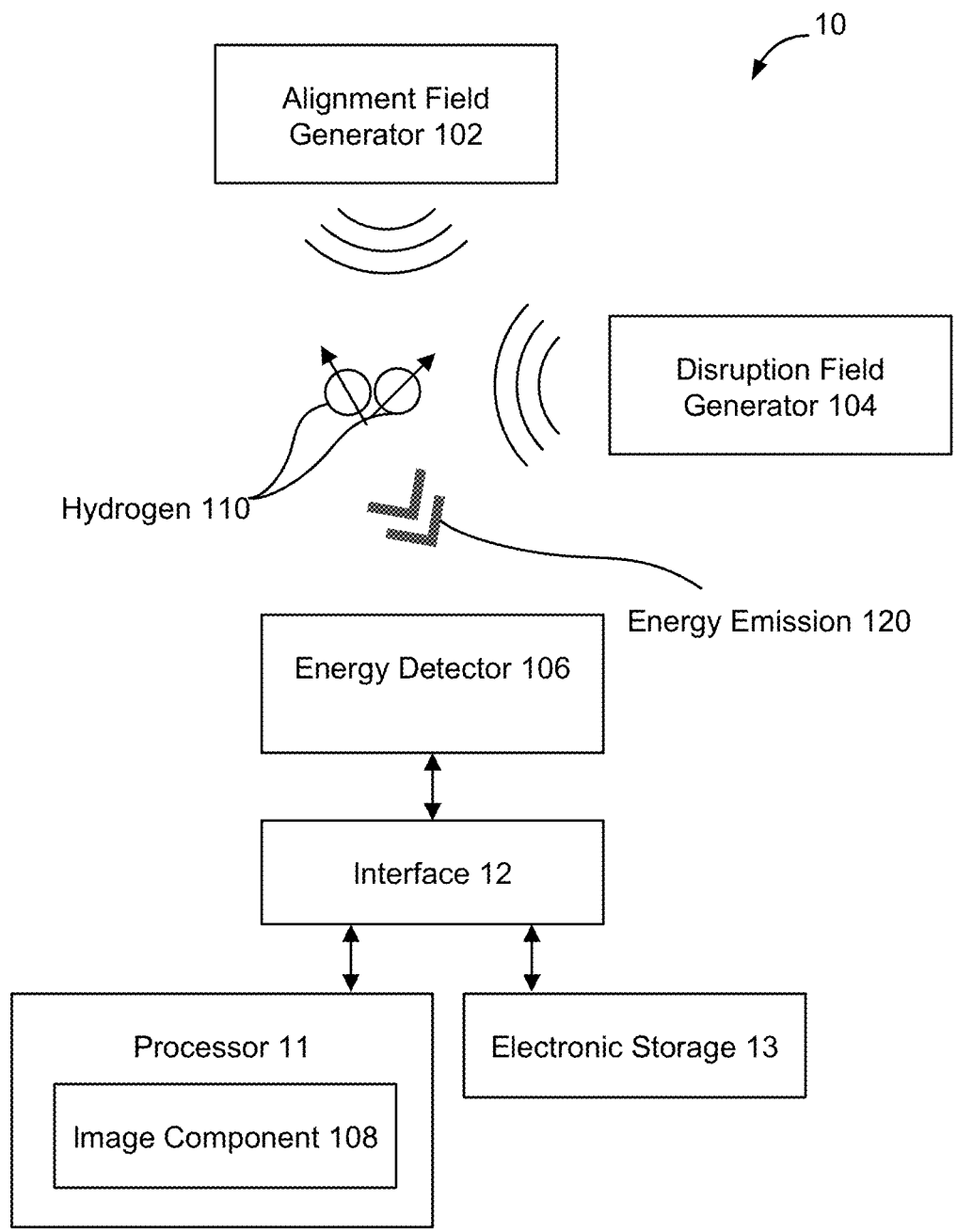
FIG. 1 illustrates an example system that images inside a structure.

The methods and systems of the present disclosure may be implemented by a system and/or in a system, such as a system 10 shown in FIG. 1. The system 10 may include one or more of a processor 11, an interface 12 (e.g., bus, wireless interface), an electronic storage 13, an alignment field generator 102, a disruption field generator 104, an energy detector 106, and/or other components. One or more alignment fields may be generated and maintained inside a structure by the alignment field generator 102. The alignment field(s) may cause alignment of hydrogen of materials inside the structure. One or more disruption fields may be generated inside the structure for a duration by the disruption field generator 104. The disruption field(s) may cause temporary misalignment of hydrogen during the duration. Realignment of the hydrogen with the alignment field(s) after the duration may cause emission of energy from the hydrogen. The energy emitted by the hydrogen during realignment of the hydrogen may be detected and output signals conveying characteristics of the energy may be generated by the energy detector 106. Image(s) of interior portion(s) of the structure may be generated based on the output signals and/or other information.

The alignment field generator 102 may refer to a device that generates one or more fields to cause alignment of atoms and/or parts of atoms of materials, such as hydrogen and/or protons of the materials. Such fields may be referred to as alignment fields. The alignment field generator 102 may convert energy (e.g., voltage, current, power) into an alignment field. The alignment field generator 102 may generate an alignment field by using static electric charges and/or moving electric charges. The alignment field generator 102 may generate an alignment field by transmission of one or more waves.

The alignment field generator 102 may be configured to generate and maintain one or more alignment fields inside a structure. Maintaining an alignment field inside a structure may include causing the alignment field to exist/continue inside the structure for a period of time. The period of time during which the alignment field is maintained inside the structure may be longer than the duration of time during which disruption field is generated by the disruption field generator 104. The period of time during which the alignment field is maintained inside the structure may precede, include, and follow the duration of time during which disruption field is generated by the disruption field generator 104. That is, the alignment field may generate and maintain the alignment field(s) inside a structure for a period of time. Within the period of time, the disruption field generator 104 may generate the disruption field.

A structure may refer to arrangement and/or organization of one or more things. Thing(s) may be arranged and/or organized into a structure to perform one or more functions. A structure may be composed of a particular type of matter or a combination of different types of matter. For example, a structure may include a metallic and/or non-metallic materials. A structure may include a rigid structure, a flexible structure, and/or other structure. A structure may include a static structure, a moving structure, and/or other structure. A structure may have a symmetrical shape or an asymmetrical shape. A structure may include one or more simple geometric shapes, one or more arbitrarily complex geometric shapes, and/or other geometric shapes.

A structure may include space inside the structure. A structure may include an open structure in which the space inside the structure is exposed (e.g., via one or more openings) to the outside of the structure. A structure may include a closed structure in which the space inside the structure is not exposed to the outside of the structure. Examples of a structure include a well, a portion of a well, a tank, a portion of tank, other structures.

The structure may include one or more materials. Materials included in a structure may include materials that make up the structure/boundary of the structure (e.g., materials that make up the tank, materials that make up casings of a well, materials that make up bottom of a well). Materials included in a structure may include materials contained within the structure (e.g., materials inside a well, materials inside a tank).

The alignment field(s) generated and maintained inside a structure may cause alignment of atoms and/or parts of atoms (e.g., hydrogen 110) of materials inside the structure. Inside the structure may refer to interior part(s) of the structure and/or space(s) inside the structure. The alignment field(s) may rotate/twist the orientations of atoms and/or parts of atoms so that atoms and/or parts of atoms are aligned with the alignment field(s). The alignment field(s) may cause different energy eigenstates of atoms and/or parts of atoms. For example, the alignment field(s) may cause a spin ½ proton in a hydrogen nucleus to have two energy eigenstates, with most of the protons falling into the lower of the two states after a period of time. Different types of alignment fields may be used to cause alignment of atoms and/or parts of atoms of materials inside the structure. For example, the alignment field generator 102 may include one or more of a static magnetic field generator, a magneto-quasistatic field generator, and/or other alignment field generator.

A static magnetic field generator may be configured to generate and maintain one or more static magnetic fields inside the structure. The static magnetic field(s) may cause alignment of atoms and/or parts of atoms (e.g., hydrogen 110) of materials inside the structure. In some implementations, metallic materials included in a structure may cause distortion of the static magnetic field. Metallic materials included in a structure may block the static magnetic field and cause noise when imaging the structuring.

A magneto-quasistatic field generator may be configured to generate and maintain one or more magneto-quasistatic fields inside the structure. The magneto-quasistatic field(s) may cause alignment of atoms and/or parts of atoms (e.g., hydrogen 110) of materials inside the structure. A magneto-quasistatic field may refer to a class of electromagnetic field in which a slowly oscillating magnetic field is dominant. A magneto-quasistatic field may be generated by low-frequency induction (e.g., in ones, tens, or hundreds of kilo hertz range) from a magnetic dipole or a current loop. The frequency of the wave(s) used to generate the magneto-quasistatic field may be adjusted based on the desired range at which the magneto-quasistatic field is to be generated.

A magneto-quasistatic field may pass through or near non-metallic materials with little loss/distortion. A magneto-quasistatic field may have higher degree/capability of penetration through metallic materials. A magneto-quasistatic field may cause better alignment of atoms and/or parts of atoms (e.g., hydrogen 110) of materials inside the structure than the static magnetic field. For example, a magneto-quasistatic field may cause higher degree of alignment and/or more uniform/consistent alignment of atoms and/or parts of atoms of materials inside the structure than the static magnetic field.

A magneto quasistatic field generator may include one or more antennas to generate the magneto-quasistatic field(s). The antenna(s) may convert energy (e.g., voltage, current, power) into waves, which are transmitted inside the structure to generate magneto quasistatic field(s) inside the metallic environment. In some implementations, the antennas of the magneto quasistatic field generator may be positioned orthogonally. For example, the magneto quasistatic field generator 14 may include three coils to generate the magneto-quasistatic field(s). The coils may be positioned at different angles with respect to each other to generate the magneto-quasistatic field(s) in different directions. For example, one coil may be positioned in a leveled orientation. Another coil may be rotated by ninety-degrees about a horizontal axis. Another coil may be rotated by ninety-degrees about a vertical axis. Other numbers, configurations, and arrangements of antennas are contemplated.

The disruption field generator 104 may refer to a device that generates one or more fields to cause temporary misalignment of atoms and/or parts of atoms of materials, such as hydrogen or protons of the materials. Such fields may be referred to as disruption fields. The disruption field generator 104 may convert energy (e.g., voltage, current, power) into a disruption field. The disruption field generator 104 may generate a disruption field by using static electric charges and/or moving electric charges. The disruption field generator 104 may generate a disruption field by transmission of one or more waves.

The disruption field generator 104 may be configured to generate one or more fields (disruption fields) inside the structure for a duration. Generating a disruption field inside the structure may include causing the disruption field to exist temporarily inside the structure for the duration. Generating a disruption field inside the structure may include causing one or more pulses of disruption field inside the structure for the duration. The duration during which the disruption field is generated may be shorter than the duration of time during which alignment field is generated by the alignment field generator 102. The duration during which the disruption field is generated inside the structure may span a portion of the period of time during which the alignment field is maintained inside the structure. That is, the disruption field generator 104 may generate the disruption field during a part of the period of time in which the alignment field is maintained inside the structure.

The disruption field generator 104 may generate a disruption field in a different direction than the direction of the alignment field generated by the alignment field generator 102. For example, the direction of the disruption field may be offset from the direction of the alignment field by up to 90 degrees. Other degrees of offset between the disruption field and the alignment field are contemplated.

A disruption field generated by the disruption field generator 104 may cause temporary misalignment of atoms and/or parts of atoms of materials inside the structure during the duration. The disruption field may excite/disrupt the atoms and/or parts of atoms and/or cause the atoms and/or parts of atoms to not be aligned with an alignment field maintained by the alignment field generator 102. The disruption field may cause the atoms and/or parts of atoms to be pointed in one or more directions different from the direction of the alignment field maintained by the alignment field generator 102. The disruption field may cause change in energy states of atoms and/or parts of atoms. For example, the disruption field may excite protons of hydrogen back into higher energy state. Once the disruption field is removed, the atoms and/or parts of atoms may be realigned with the alignment field. Such alignment of the atoms and/or parts of atoms may be referred to as realignment atoms and/or parts of atoms with the alignment field.

Realignment of the atoms and/or parts of atoms with the alignment field(s) generated by the alignment field generator 102 after the duration of the disruption field(s) may cause emission of energy (e.g., electromagnetic energy) from the atoms and/or parts of atoms (e.g., energy emission 120 from the hydrogen 110). One or more characteristics of the misalignment and/or realignment of the atoms and/or parts of atoms may depend on the types of materials inside the structure. For example, the time and/or degree of misalignment by the disruption field may depend on the types of materials inside the structure. The time and/or degree of realignment after the disruption field is removed may depend on the types of materials inside the structure.

The differences in the characteristics of the misalignment and/or realignment may cause different characteristics of energy emission (e.g., different durations of energy emission, different amounts of energy emission, different intensity of energy emission, different frequency of energy emission, different types of energy emission, different patterns of energy emission) from the atoms and/or parts of atoms. The characteristics of energy emission may be used to measure physical and/or chemical properties of the materials inside the structure. The characteristics of energy emission may be used to generate one or more images of the materials inside the structure.

In some implementations, the alignment field may be varied across the inside of the structure with one or more alignment field gradients, and/or the disruption field may be varied across the inside of the structure with one or more disruption field gradients. By varying the field(s), corresponding variations in the energy emission (e.g., variation of Larmor frequency) may be used to determine the position (e.g., translational position, rotational position) of the materials.

Different types of disruption fields may be used to cause misalignment of atoms and/or parts of atoms of materials inside the structure. For example, the disruption field generator 104 may include one or more of an electromagnetic field generator, a magneto-quasistatic field generator, and/or other disruption field generator.

An electromagnetic field generator may be configured to generate one or more electromagnetic fields inside the structure for a duration. The electromagnetic field(s) may cause temporary misalignment of the atoms and/or parts of atoms of materials inside the structure during the duration. In some implementations, metallic materials included in a structure may cause distortion of the electromagnetic field. Metallic materials included in a structure may block the electromagnetic field and cause noise when imaging the structuring.

A magneto-quasistatic field generator may be configured to generate one or more magneto-quasistatic fields inside the structure for a duration. The magneto-quasistatic field(s) may cause temporary misalignment of atoms and/or parts of atoms of materials inside the structure during the duration. A magneto-quasistatic field may pass through or near non-metallic materials with little loss/distortion. A magneto-quasistatic field may have higher degree/capability of penetration through metallic materials. A magneto-quasistatic field may cause better misalignment of atoms and/or parts of atoms of materials inside the structure than the electromagnetic field. For example, a magneto-quasistatic field may cause higher degree of misalignment and/or more uniform/consistent misalignment of atoms and/or parts of atoms of materials inside the structure than the electromagnetic field.

Use of different types of alignment field generator 102 may result in different alignment of the atoms and/or parts of atoms of materials inside the structure. Use of different types of disruption field generator 104 may result in different misalignment of the atoms and/or parts of atoms of materials inside the structure. For example, a static magnetic field generator may be used as the alignment field generator 102 to generate and maintain a static magnetic field inside the structure, with the static magnetic field causing alignment of hydrogen 110 of materials inside the structure. A magneto-quasistatic field generator may be used as the disruption field generator 104 to generate a magneto-quasistatic field inside the structure for a duration. The magneto-quasistatic field may cause temporary misalignment of hydrogen 110 during the duration, and realignment of the hydrogen 110 with the static magnetic field after the duration may cause emission of energy (e.g., electromagnetic energy) from the hydrogen 110.

As another example, a magneto-quasistatic field generator may be used as the alignment field generator 102 to generate and maintain a magneto-quasistatic field inside the structure, with the magneto-quasistatic field causing alignment of hydrogen 110 of materials inside the structure. An electromagnetic field generator may be used as the disruption field generator 104 to generate an electromagnetic field inside the structure for a duration. The electromagnetic field may cause temporary misalignment of the hydrogen 110 during the duration, and realignment of the hydrogen 110 with the magneto-quasistatic field after the duration may cause emission of energy (e.g., electromagnetic energy) from the hydrogen 110.

As yet another example, multiple magneto-quasistatic field generators may be used as both the alignment field generator 102 and the disruption field generator 104. For instance, one magneto-quasistatic field generator may be used as the alignment field generator 102 to generate and maintain a first magneto-quasistatic field inside the structure, with the first magneto-quasistatic field causing alignment of hydrogen 110 of materials inside the structure. Another magneto-quasistatic field generator may be used as the disruption field generator 104 to generate a second magneto-quasistatic field inside the structure for a duration. The second magneto-quasistatic field may cause temporary misalignment of the hydrogen 110 during the duration, and realignment of the hydrogen 110 with the first magneto-quasistatic field after the duration may cause emission of energy (e.g., electromagnetic energy) from the hydrogen 110. Other combinations of the alignment field generator 102 and the disruption field generator 104 are contemplated.

In some implementations, the system 10 may not include the disruption field generator 104. For example, a magneto-quasistatic field generator may be used as the alignment field generator 102 to generate and maintain a magneto-quasistatic field inside the structure, with the magneto-quasistatic field causing alignment of hydrogen 110 of materials inside the structure. The magneto-quasistatic field may be perturbed for a duration. The perturbation of the magneto-quasiparticle field may cause temporary misalignment of the hydrogen 110 during the duration, and realignment of the hydrogen 110 with the magneto-quasistatic field after the duration may cause emission of energy (e.g., electromagnetic energy) from the hydrogen 110.

The energy detector 106 may refer to a device that detects (e.g., identifies presence/existence of, measures characteristic(s) of) energy (e.g., electromagnetic energy) emitted by atoms and/or parts of atoms of materials, such as hydrogen and/or protons of materials, inside the structure. The energy detector 106 may convert energy emitted by the atoms and/or parts of atoms (e.g., hydrogen 110) into other type(s) of energy (e.g., voltage, current, power). The energy detector 106 may be configured to detect the energy emitted by the atoms and/or parts of atoms during realignment of the atoms and/or parts of atoms. The energy detector 106 may be configured to detect the energy emitted by the atoms and/or parts of atoms during realignment of the atoms and/or parts of atoms with the alignment field(s) generated and maintained by the alignment field generator 102. The type of energy detector 106 used may depend on the type of energy emitted by the atoms and/or parts of atoms. For example, energy detector 106 may include an electromagnetic energy detector to detect electromagnetic energy emitted by the atoms and/or parts of atoms. Use of other energy detectors are contemplated.

The energy detector 106 may be configured to generate output signals conveying one or more characteristics of the energy and/or other information. A characteristic of energy may refer to one or more features and/or one or more quality of the energy. For example, a characteristic of the energy emitted by the atoms and/or parts of atoms may include duration of energy emission, amounts of energy emission, intensity of energy emission, frequency of energy emission, types of energy emission, patterns of energy emission, and/or other characteristic of the energy emitted by the atoms and/or parts of atoms.

For example, the energy detector 106 may measure relaxation magnetic fields produced by precessing moments of nuclei resonance in materials after they have been energized by an external field. The energy detector 106 may measure and/or the measurements by the energy detector 106 may be used to determine quantum mechanical magnetic properties of the atomic nucleus, thus measuring/enabling measurements of the physical and/or chemical environment.

While hydrogen 110 is shown in FIG. 1, this is merely as an example and is not meant to be limiting. Other atoms may be used to improve contrast and/or signal. For example, polarized atom besides hydrogen may be used as contrast agent to perform imaging.

The electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store information relating to a structure, information relating to magnetic field, information relating to magneto-quasistatic field, information relating to electromagnetic field, information relating to alignment of atoms and/or parts of atoms, information relating to misalignment of atoms and/or parts of atoms, information relating to realignment of atoms and/or parts of atoms, information relating to emission of energy from atoms and/or parts of atoms, information relating to energy emitted by atoms and/or parts of atoms, information relating to image of an interior portion of a structure, and/or other information.

The processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate imaging inside a structure. The machine-readable instructions 100 may include one or more computer program components. The machine-readable instructions 100 may include an image component 108, and/or other computer program components.

The processor 11 may be located with or separately from one or more components of the system 10. For example, the processor 11 may be located with the energy detector 106 and may use the output signals of the energy detector 106 to generate image(s) of interior portion(s) of the structure. For instance, the processor 11 may be packaged with the energy detector 106 to perform imaging as the energy emission from the hydrogen 110 are detected by the energy detector 106 (e.g., generating visual representation(s) of the materials by scanning the materials). The processor 11 may be located separately from the energy detector 106, may obtain information conveyed by the output signals, and may use the information to generate image(s) after data collection (e.g., scanning) has been completed by the energy detector 106. For instance, information conveyed by the output signals and/or information characterizing the output signals may be stored by the energy detector 106 for retrieval by the processor 11 after data collection to generate image(s).

The image component 108 may be configured to generate one or more images of one or more interior portions of the structure based on the output signals generated by the energy detector 106 and/or other information. An interior portion of the structure may refer to a point, an area, or a volume inside the structure. An interior portion of the structure may include a part of the structure and/or a part of a space within the structure. An image may refer to a visual representation of the interior portion(s) of the structure. An image may include a two-dimensional image (two-dimensional visual representation), a three-dimensional image (three-dimensional visual representation), and/or other dimensional image. An image of an interior portion of the structure may include an image of the materials within the interior portion of the structure.

In some implementations, generation of image(s) based on the output signals may include determination of the characteristics of the energy conveyed by the output signals and generation of the image(s) based on the characteristics of the energy. For example, the image component 108 may generate image(s) of an interior portion of the structure based on the duration of energy emission, amounts of energy emission, intensity of energy emission, frequency of energy emission, types of energy emission, patterns of energy emission, and/or other characteristic of the energy emitted by the atoms and/or parts of atoms (e.g., hydrogen 110). For example, the intensity of the energy may be plotted on a grey scale and cross section images of the interior portion of the structure may be built up.

In some implementations, generating image(s) of an interior portion of the structure based on the output signals may include measuring physical and/or chemical properties of the interior portion of the structure. For example, the duration of energy emission, amounts of energy emission, intensity of energy emission, frequency of energy emission, types of energy emission, patterns of energy emission, and/or other characteristic of the energy emitted by the atoms and/or parts of atoms may be used to determine the physical and/or chemical properties of the material within the interior portion of the structure.

Figure 3A:
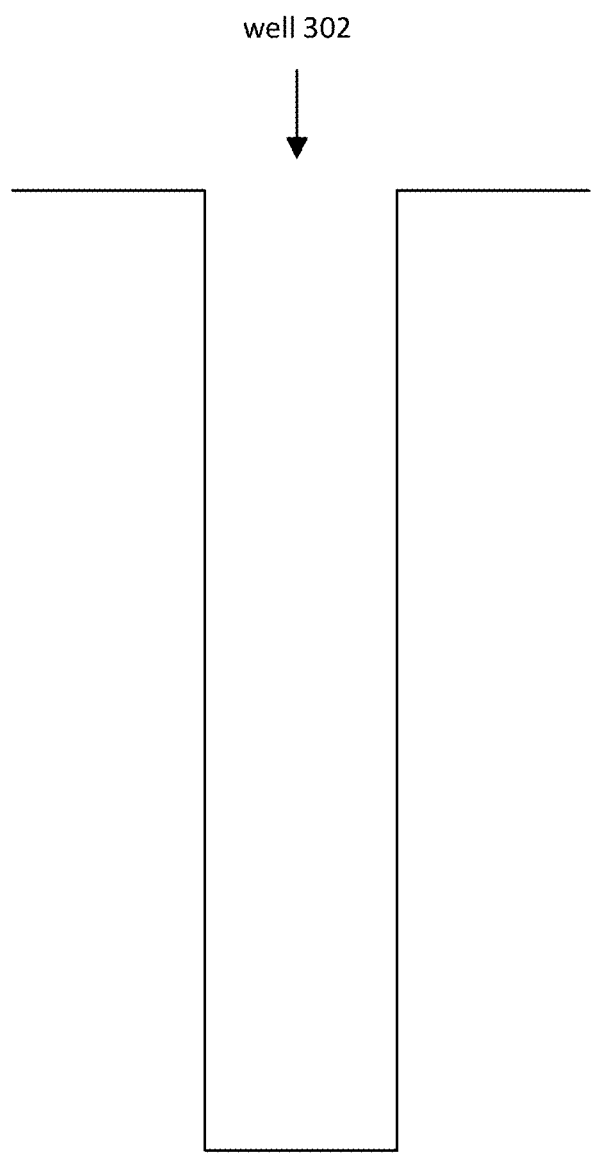
FIGS. 3A, 3B, and 3C illustrate example scenarios using magneto quasistatic fields to image inside a structure.

The image(s) of the interior portion(s) of the structure may be used for analysis of the structure and/or analysis of materials inside the structure. For example, the structure may include a well (e.g., vertical well, lateral well, deviating well), and the image(s) of interior portion(s) of the well may facilitate condition determination of the well. Condition determination of a well may refer to determining (e.g., assessing, evaluating) condition of the well. For example, FIG. 3A illustrates an example well 312. The well 312 may be formed of composite materials, such as concrete, and/or metallic materials, such as steel. The image(s) of parts of the well 312 (e.g., well walls, well casings) and/or parts of space inside the well may be used to determine the condition of the well 312. For instance, the well 312 may include a decommissioned well, and the image(s) of the interior portion(s) of the well 312 may be used to determine the condition of the decommissioned well prior to plugging and/or abandonment. For example, the image(s) of the interior portion(s) of the well 312 may be used to evaluate the structure of the well and/or any materials left inside the well.

Figure 3B:
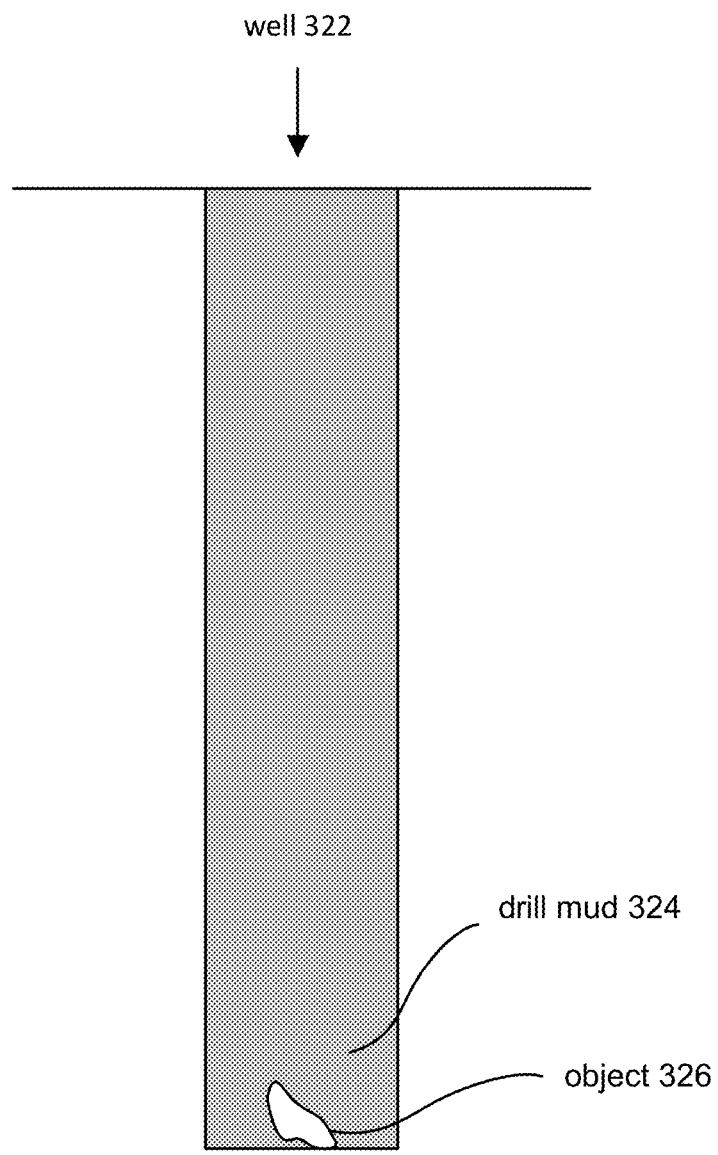

As another example, the structure may include a well, and one or more objects may be located inside the well. It may be difficult to determine the identity, condition, location, and/or orientation of the object(s) (e.g., debris, equipment, rock) inside the well using visual and/or acoustic techniques (e.g., imaging using visual and/or acoustic camera). For example, FIG. 3B illustrates an example well 322. The well 322 may include drill mud 324 at the bottom. An object 326 may be located inside the drill mud 324 of the well 322 (e.g., floating on top of the drill mud 324, floating inside the drill mud 324, dropped at the bottom of the drill mud 324). The drill mud 324 and/or other conditions inside the well 322 may make it difficult to determine the location of the object 326.

The image(s) of interior portion(s) of the well 322 may facilitate location determination of the object 326 within the drill mud 324 of the well 322. The image(s) may show where the object 326 is located within the well 322. The image(s) may show translational position (location in the XYZ space) and/or rotational position (rotation about XYZ axes) of the object 326. The image(s) may show condition of the object 326 (e.g., enable assessment of whether the object 326 is intact or broken, determine structural integrity of the object 326, determine likelihood of being able to grab and/or pick up the object 326). The image(s) may enable mitigation measures (e.g., object retrieval) to be more focused and directed, and may save significant downtime for the well 322.

In some implementations, one or more contrast agents may be added to the structure to perform imaging. The contrast agent(s) may be used as materials/atoms/parts of atoms from which energy is emitted. The contrast agent(s) may enable imaging of materials that are not excited/not sufficiently excited by magnetic fields. For example, the drill mud 324 may be doped with polarized atom as the contrast agent. For instance, the object 326 may not be excited/not sufficiently excited by the alignment fields/disruption fields, and may not emit energy or may not emit sufficient amount of energy for the energy detector 106. To image the object 326, contrast agent(s) may be added to the drill mud 324, and the image(s) may depict the coloring agent(s). The image(s) of the object(s) may be obtained by inverting the image(s) of the coloring agent(s).

Figure 3C:
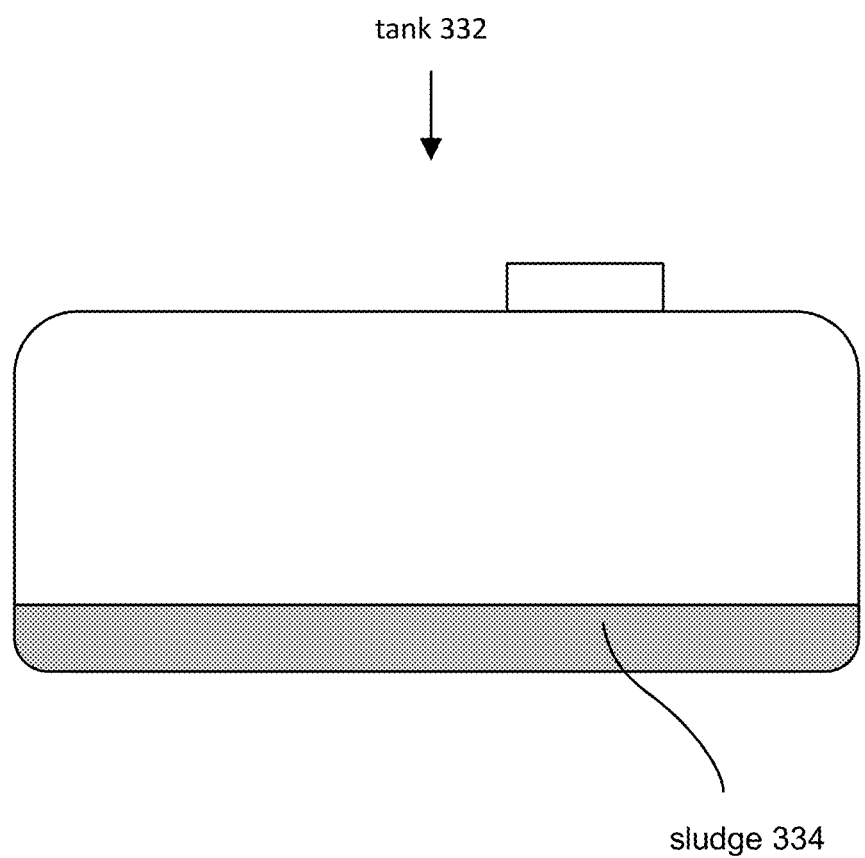

As yet another example, the structure may include a tank, and the image(s) of interior portion(s) of the tank may facilitate condition determination of the tank and/or localization of object(s) inside the tank. For example, FIG. 3C illustrates a tank 332. The tank 322 may include sludge 334 at the bottom of the tank 332. The sludge 334 may prevent/limit inspection of the tank bottom or make the inspection of the tank bottom difficult and/or dangerous. The image(s) of interior portion(s) of the tank 332 may facilitate tank bottom inspection of the tank 332 without removal of the sludge 334. Thus, inspection of the tank 332 may be performed without removal of the sludge 334 (e.g., cleaning, venting, desludging before inspection) and may reduce risk to cleaning personnel.

While the disclosure herein has been described with respect to use of magneto-quasistatic fields to perform imaging, other types of field may be used to perform imaging. For example, imaging using magneto-quasistatic fields may be limited in heavy metal environments. A magneto-quasistatic field traveling through metallic materials may be distorted by the metallic materials. The distortion of the magneto-quasistatic field may result in poor alignment and/or misalignment. The distortion of the magneto-quasistatic field may result in inaccurate imaging of the target area/volume. That is, the distortion of the magneto-quasistatic field may degrade the accuracy of the generated image(s). The scanning quality/accuracy of imaging system through metallic material may be increased via addition of one or more electric quasistatic fields to produce magneto-electric quasistatic field(s). A magneto-electric quasistatic field may include one or more magnetic quasistatic fields and one or more electric quasistatic fields. The distortion in magnetic quasistatic field(s) caused by transmission through metallic materials may be corrected using electric quasistatic field(s), resulting in improved accuracy of the imaging system. The magneto-electric quasistatic field may be used to scan and image target areas/volumes through metallic materials. For example, the magneto-electric quasistatic field may be used to scan through metallic walls of a well to image the reservoir around/near the well. Magneto-electric quasistatic field generator inside the well may be used to image materials inside the well, image the walls of the well, and/or the materials outside the well. Other imaging through metallic materials using magneto-electric quasistatic field are contemplated.

In some implementations, one or more of the alignment field generator 102, the disruption field generator 104, and/or the energy detector 106 may be attached to a tool for placement within the structure. For example, the structure may include a well, and the alignment field generator 102, the disruption field generator 104, and/or the energy detector 106 may be attached to a portion (e.g., end portion) of a drill string for placement within the well. As another example, the structure may include a tank, and the alignment field generator 102, the disruption field generator 104, and/or the energy detector 106 may be attached to a floatation device, a hovering device, a mounting device, and/or a rod for placement within the tank. For instance, the alignment field generator 102, the disruption field generator 104, and/or the energy detector 106 may be placed above, below and/or next to the target area/volume (e.g., area/volume of the structure to be examined, area/volume of the structure that may contain the object). The alignment field generator 102 and the disruption field generator 104 may be placed in different locations and/or at different orientations with respect to the target area/volume so that the alignment field generator 102 and the disruption field generator 104 generate fields in different directions. Use of other tools for placement of the alignment field generator 102, the disruption field generator 104, and/or the energy detector 106 within the structure are contemplated. Other placements and/or other orientations of the alignment field generator 102, the disruption field generator 104, and/or the energy detector 106 with respect to the target area/volume are contemplated.

The present disclosure may be utilized to facilitate imaging of a variety of materials in a variety of locations. Imaging may facilitate study of the materials. For example, the present disclosure may be utilized to image the interior of a structure to perform inspection of the interior of the structure, measure interior of the structure, and/or perform thickness measurement. Example usage of the present disclosure includes reservoir/seismic imaging (e.g., reservoir imaging in subsurface in depth 0-30 km), well logging (e.g., one foot depth of rock characteristics to be measured through one inch of drilling mud), cementing integrity verification (e.g., measuring cement thickness, such as up to one foot, through drilling mud and metal casing), downhole fishing (e.g., bottom hole imaging of irregular 3D shapes inside mud), corrosion sensing/wall thickness measurement (e.g., non-intrusive measurement of wall thickness in fluid environment), and inspection of crude oil tanks through sludge. Other imaging applications are contemplated.

While the present disclosure is described with respect to imaging by maintaining a field to cause alignment of materials and generating another field to cause temporarily misalignment of the materials, magneto quasistatic fields may be used to improve/facilitate other imaging techniques. For example, magneto quasistatic fields may be used in imaging techniques that utilize flux in field generation and/or differences in charging/discharging effort of a field under action of a surrounding field (e.g., the earth's magnetic field).

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11, the electronic storage 13, and the energy detector 106 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11, the electronic storage 13, the alignment field generator 102, the disruption field generator 104, and the energy detector 106 are shown in FIG. 1 as single entities, this is for illustrative purposes only. One or more of the components of the system 10 may be contained within a single device or across multiple devices. For instance, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented.

The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
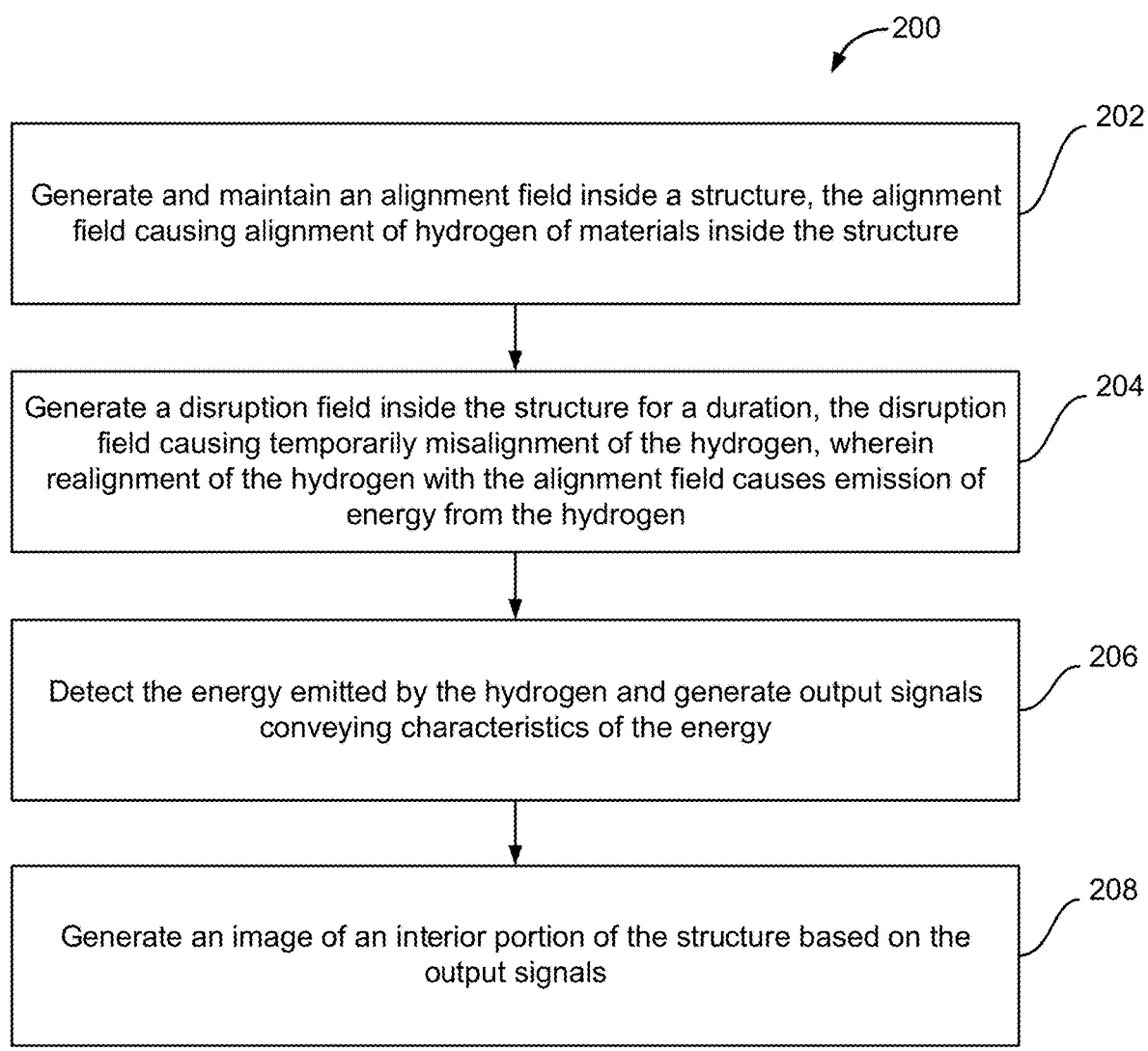
FIG. 2 illustrates an example method for imaging inside a structure.

FIG. 2 illustrates method 200 for imaging inside a structure. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, at operation 202, one or more alignment fields may be generated and maintained inside a structure. The alignment field(s) may cause alignment of hydrogen of materials inside the structure. In some implementation, operation 202 may be performed by a component the same as or similar to the alignment field generator 102 (Shown in FIG. 1 and described herein).

At operation 204, one or more disruption fields may be generated inside the structure for a duration. The disruption field(s) may cause temporary misalignment of the hydrogen during the duration. Realignment of the hydrogen with the alignment field(s) after the duration may cause emission of energy from the hydrogen. In some implementation, operation 204 may be performed by a component the same as or similar to the disruption field generator 104 (Shown in FIG. 1 and described herein).

At operation 206, the energy emitted by the hydrogen during realignment of the hydrogen may be detected and output signals conveying characteristics of the energy may be generated. In some implementation, operation 206 may be performed by a component the same as or similar to the energy detector 106 (Shown in FIG. 1 and described herein).

At operation 208, image(s) of interior portion(s) of the structure may be generated based on the output signals and/or other information. In some implementation, operation 208 may be performed by a processor component the same as or similar to the image component 108 (Shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for imaging inside a structure including metallic materials, the system comprising:
   a static magnetic field generator configured to generate and maintain a static magnetic field inside the structure, the static magnetic field causing alignment of hydrogen of materials inside the structure, wherein the metallic materials included in the structure cause distortion of the static magnetic field;
   a magneto-quasistatic field generator configured to generate a magneto-quasistatic field inside the structure for a duration using a low-frequency induction, the magneto-quasistatic field causing temporary misalignment of the hydrogen during the duration, wherein the magneto-quasistatic field has higher degree of penetration through the metallic materials included in the structure than the static magnetic field and causes more uniform misalignment of the hydrogen than the alignment of the hydrogen by the static magnetic field, and realignment of the hydrogen with the static magnetic field after the duration causes emission of electromagnetic energy from the hydrogen;
   an electromagnetic energy detector configured to detect the electromagnetic energy emitted by the hydrogen and generate output signals conveying characteristics of the electromagnetic energy; and
   one or more processors configured to generate an image of an interior portion of the structure based on the output signals.

2. The system of claim 1, wherein generating the image of the interior portion of the structure based on the output signals includes measuring physical and/or chemical properties of the interior portion of the structure.

3. The system of claim 1, wherein the structure includes a well, and the image of the interior portion of the well facilitates condition determination of the well.

4. The system of claim 1, wherein the structure includes a well, an object is located inside drill mud of the well, and the image of the interior portion of the well facilitates location determination of the object within the drill mud of the well.

5. The system of claim 1, wherein the structure includes a tank, the tank includes sludge, and the image of the interior portion of the tank facilitates tank bottom inspection of the tank without removal of the sludge.

6. The system of claim 1, wherein the structure includes a well, and the magneto-quasistatic field generator is attached to an end portion of a drill string for placement within the well.

7. A system for imaging inside a structure including metallic materials, the system comprising:
   a magneto-quasistatic field generator configured to generate and maintain a magneto-quasistatic field inside the structure using a low-frequency induction, the magneto-quasistatic field causing alignment of hydrogen of materials inside the structure;
   an electromagnetic field generator configured to generate an electromagnetic field inside the structure for a duration, the electromagnetic field causing temporary misalignment of the hydrogen during the duration, wherein the metallic materials included in the structure cause distortion of the electromagnetic field, the magneto-quasistatic field has higher degree of penetration through the metallic materials included in the structure than the electromagnetic field and causes more uniform alignment of the hydrogen than the misalignment of the hydrogen by the electromagnetic field, and realignment of the hydrogen with the magneto-quasistatic field after the duration causes emission of electromagnetic energy from the hydrogen;
   an electromagnetic energy detector configured to detect the electromagnetic energy emitted by the hydrogen and generate output signals conveying characteristics of the electromagnetic energy; and
   one or more processors configured to generate an image of an interior portion of the structure based on the output signals.

8. A system for imaging inside a structure including metallic materials, the system comprising:
   a first magneto-quasistatic field generator configured to generate and maintain a first magneto-quasistatic field inside the structure using a first low-frequency induction, the first magneto-quasistatic field causing alignment of hydrogen of materials inside the structure;
   a second magneto-quasistatic field generator configured to generate a second magneto-quasistatic field inside the structure for a duration using a second low-frequency induction, the second magneto-quasistatic field causing temporary misalignment of the hydrogen during the duration, wherein the magneto-quasistatic field has higher degree of penetration through the metallic materials included in the structure than a static magnetic field or an electromagnetic field and causes more uniform alignment or misalignment of the hydrogen than alignment or misalignment of the hydrogen by static magnetic field or the electromagnetic field, and realignment of the hydrogen with the first magneto-quasistatic field after the duration causes emission of electromagnetic energy from the hydrogen;

an electromagnetic energy detector configured to detect the electromagnetic energy emitted by the hydrogen and generate output signals conveying characteristics of the electromagnetic energy; and one or more processors configured to generate an image of an interior portion of the structure based on the output signals.

9. A method for imaging inside a structure including metallic materials, the method comprising:

generating and maintaining, by a static magnetic field generator, a static magnetic field inside the structure, the static magnetic field causing alignment of hydrogen of materials inside the structure, wherein the metallic materials included in the structure cause distortion of the static magnetic field;

generating, by a magneto-quasistatic field generator, a magneto-quasistatic field inside the structure for a duration using a low-frequency induction, the magneto-quasistatic field causing temporary misalignment of the hydrogen during the duration, wherein the magneto-quasistatic field has higher degree of penetration through the metallic materials included in the structure than the static magnetic field and causes more uniform misalignment of the hydrogen than the alignment of the hydrogen by the static magnetic field, and realignment of the hydrogen with the static magnetic field after the duration causes emission of electromagnetic energy from the hydrogen;

detecting, by an electromagnetic energy detector, the electromagnetic energy emitted by the hydrogen and generate output signals conveying characteristics of the electromagnetic energy; and generating an image of an interior portion of the structure based on the output signals.

10. The method of claim 9, wherein generating the image of the interior portion of the structure based on the output signals includes measuring physical and/or chemical properties of the interior portion of the structure.

11. The method of claim 9, wherein the structure includes a well, and the image of the interior portion of the well facilitates condition determination of the well.

12. The method of claim 9, wherein the structure includes a well, an object is located inside drill mud of the well, and the image of the interior portion of the well facilitates location determination of the object within the drill mud of the well.

13. The method of claim 9, wherein the structure includes a tank, the tank includes sludge, and the image of the interior portion of the tank facilitates tank bottom inspection of the tank without removal of the sludge.

14. The method of claim 9, wherein the structure includes a well, and the magneto-quasistatic field generator is attached to an end portion of a drill string for placement within the well.

15. The system of claim 1, wherein:

the magneto-quasistatic field is distorted by the metallic materials included in the structure;

the distortion in the magneto-quasistatic field reduces accuracy of the image of the interior portion of the structure; and the accuracy of the image of the interior portion of the structure is increased via addition of an electric quasistatic field to generate a magneto-electric quasistatic field, wherein the distortion in the magneto-quasistatic field caused by the metallic materials included in the structure is corrected using the electric quasistatic field.

16. The system of claim 7, wherein:

the magneto-quasistatic field is distorted by the metallic materials included in the structure;

the distortion in the magneto-quasistatic field reduces accuracy of the image of the interior portion of the structure; and the accuracy of the image of the interior portion of the structure is increased via addition of an electric quasistatic field to generate a magneto-electric quasistatic field, wherein the distortion in the magneto-quasistatic field caused by the metallic materials included in the structure is corrected using the electric quasistatic field.

17. The system of claim 8, wherein:

the first magneto-quasistatic field and/or the second magneto-quasistatic field are distorted by the metallic materials included in the structure;

the distortion in the first magneto-quasistatic field and/or the second magneto-quasistatic field reduces accuracy of the image of the interior portion of the structure; and the accuracy of the image of the interior portion of the structure is increased via addition of one or more electric quasistatic fields to generate one or more magneto-electric quasistatic fields, wherein the distortion in the first magneto-quasistatic field and/or the second magneto-quasistatic field caused by the metallic materials included in the structure are corrected using the one or more electric quasistatic fields.

18. The method of claim 9, wherein:

the magneto-quasistatic field is distorted by the metallic materials included in the structure;

the distortion in the magneto-quasistatic field reduces accuracy of the image of the interior portion of the structure; and the accuracy of the image of the interior portion of the structure is increased via addition of an electric quasistatic field to generate a magneto-electric quasistatic field, wherein the distortion in the magneto-quasistatic field caused by the metallic materials included in the structure is corrected using the electric quasistatic field.

\* \* \* \* \*